United States Patent
Cha et al.

(10) Patent No.: US 7,345,551 B2
(45) Date of Patent: Mar. 18, 2008

(54) FREQUENCY SYNTHESIZER FOR MIXING REFERENCE FREQUENCIES

(75) Inventors: Choong-yul Cha, Yongin-si (KR); Hoon-tae Kim, Yongin-si (KR); Chun-deok Suh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 72 days.

(21) Appl. No.: 11/353,972

(22) Filed: Feb. 15, 2006

(65) Prior Publication Data

US 2006/0183455 A1 Aug. 17, 2006

(30) Foreign Application Priority Data

Feb. 17, 2005 (KR) ............ 10-2005-0013276

(51) Int. Cl.
*H04B 1/26* (2006.01)
(52) U.S. Cl. .................... 331/30; 455/323
(58) Field of Classification Search ............. 331/30; 455/323

See application file for complete search history.

(56) References Cited

U.S. PATENT DOCUMENTS

2005/0255822 A1* 11/2005 Friedrich et al. .......... 455/323

FOREIGN PATENT DOCUMENTS

KR 1998-065461 A 4/1999

\* cited by examiner

*Primary Examiner*—Joseph Chang
(74) *Attorney, Agent, or Firm*—Sughrue Mion, PLLC

(57) ABSTRACT

A frequency synthesizer for mixing reference frequencies using at least one control signal has a local oscillator, frequency dividers for dividing a frequency generated from the local oscillator and generating at least one control signal, and a single side band (SSB) mixer for mixing the reference frequencies, using the frequency generated from the local oscillator and the control signal. The frequency synthesizer has a simplified structure, and can easily mix reference frequency signals without a need for additional power.

10 Claims, 3 Drawing Sheets

FREQUENCY SYNTHESIZER FOR MIXING REFERENCE FREQUENCIES

CROSS-REFERENCE TO RELATED APPLICATIONS

This application claims benefit under 35 U.S.C. § 119 from Korean Patent Application No. 2005-13276, filed on Feb. 17, 2005, the entire contents of which are incorporated herein by reference.

BACKGROUND OF THE INVENTION

1. Field of the Invention

The present invention relates to a frequency synthesizer, and more particularly to a frequency synthesizer for receiving and sending signals in a wideband wireless communication system receiving and sending data in multiple bands.

2. Description of the Related Art

In general, in the wireless communication systems, the transmitters use one or more carrier signals to convert one or more base-band information signals into a radio frequency (RF) signal for transmissions, and the receivers eliminate a carrier signal from a received RF signal, convert the resultant signal into an intermediate frequency (IF) signal, and demodulate the IF signal or directly demodulate the RF signal without the conversion into the RF signal.

The wireless communication system uses frequencies in a certain frequency band in order to send data. However, as more data is sent through the wireless communication system, the frequency band also increases. Such a wide frequency band is referred to as the Ultra Wide Band (UWB).

Since the wireless communication system uses a carrier frequency to send data to a receiver, the wireless communication system first generates the carrier frequency to send data.

The communication system uses a local oscillator (LO) to generate a frequency for data transmissions. That is, the communication system uses a signal generated from the local oscillator to send data, or first performs a certain process if the signal generated from the local oscillator is not a proper signal. In other words, the communication system uses a specific signal to perform a certain process with a signal generated from the local oscillator, so as to generate a proper signal. Hereinafter, a signal generated from the local oscillator is referred to as a local oscillation signal (LO signal).

The UWB communication system divides the UWB into plural frequency sub-band of a certain bandwidth, and uses the plural frequency sub-bands to send data for a specific time period, so as to send lots of data for the specific time period. Such an UWB communication system generally uses the intermediate frequencies (IFs) 3432 MHz, 3960 MHz, and 4488 GHz of three frequency sub-bands. Thus, the UWB communication system uses a signal generated from the local oscillator to generate the intermediate frequencies of the three frequency sub-bands.

FIG. 1 is a view for showing a general frequency synthesizer for generating the intermediate frequencies of the three frequency sub-bands.

The frequency synthesizer shown in FIG. 1 is built in a structure used in the direct conversion multi-band orthogonal frequency division multiplexed (OFDM) UWB system, and has frequency even-dividers and plural SSB mixers. Further, the oscillation frequency of the local oscillator 10 is set to 4224 MHz in order for the UWB system to generate the intermediate frequencies of the three frequency sub-bands through the even frequency divisions. The phase locked loop (PLL) 20 stabilizes a reference frequency generated from the local oscillator 10.

The two frequency dividers 30 and 40 use a reference frequency of 4224 MHz generated from the local oscillator 10 so as to generate control frequencies of 528 MHz and 264 MHz, and the first single side band (SSB) mixer 50 mixes the control frequencies of 528 MHz and 264 MHz so as to generate a control frequency of 792 MHz.

The selection unit 60 selectively inputs the generated control frequencies of 264 MHz and 792 MHz to the second SSB mixer 70, and the second SSB mixer 70 mixes the reference frequency of 4224 MHz generated from the local oscillator 10 with the control frequencies of 264 MHz and 792 MHz input from the selection unit 60, so as to generate three center frequencies of 4488 MHz, 3960 MHz, and 3432 MHz.

In the frequency synthesizer shown in FIG. 1, the signal generated from the local oscillator 10 is a Quadrature signal containing the I and Q signals, but the structure shown in FIG. 1 lacks detailed components for generating the Quadrature signal. Further, FIG. 1 does not show details on the structures of the SSB mixers, and reveals a problem of difficulties in estimating electric power consumption.

Meanwhile, FIG. 2 is a view for showing another general frequency synthesizer for generating center frequencies of the three frequency sub-bands.

The frequency synthesizer shown in FIG. 2 has a structure used in the Double-Conversion multi-band OFDM UWB system, uses plural frequency dividers to enable the synthesizing of double-conversion frequencies, and uses two Poly-Phase Filters (PPFs) to generate a Quadrature signal for synthesizing frequencies of SSB mixers. Further, the oscillation frequency of the local oscillator 110 of the UWB system is set to 2640 MHz in order that the center frequencies of the three frequency sub-bands are generated. Further, the oscillation frequency of the local oscillator 110 is set to 2640 MHz in order that the UWB system generates the center frequencies of the three frequency sub-bands. Furthermore, the phase locked loop (PLL) 130 stabilizes the reference frequency generated from the local oscillator 110.

The two frequency dividers 120 and 140 uses the reference frequency of 2640 MHz generated from the local oscillator 110 to generate the control frequencies of 1320 MHz and 528 MHz, and the first and second PPF 150 and 160 control the phases of signals of 528 MHz and 2640 MHz to generate Quadrature signals. Further, the SSB mixer 170 mixes the Quadrature signals of 528 MHz and 2640 MHz to generate 2112 MHz and 3168 MHz frequencies.

The generated signals of 2112 MHz and 3168 MHz are input to the switch 180, and the switch 180 outputs either the 2640 MHz signal generated from the local oscillator 110 or any of the 2112 MHz and 3168 MHz signals as a first output signal of the frequency synthesizer. Further, the 1320 MHz signal generated from the frequency divider 120 is output as a second output signal of the frequency synthesizer, and the first and second output signals are used together for generation of the RF signal at the transmitter side and for restoration of the IF signal at the receiver side.

The frequency synthesizer shown in FIG. 2 uses the two PPFs to generate the Quadrature signals for mixing frequencies at the SSB mixer with respect to the signals generated from the local oscillator 110, but, in its structure, the frequency synthesizer has to have additional buffers to compensate for signal attenuation caused by the operations of the PPFs, which causes a problem of more power consumption.

SUMMARY OF THE INVENTION

The present invention has been developed in order to solve the above drawbacks and other problems associated with the conventional arrangement. An aspect of the present invention is to provide a frequency synthesizer having a simplified hardware structure for signal transmission and receptions and capable of easily mixing center frequencies in a wideband wireless communication system using multiple bands for data transmissions and receptions.

The foregoing and other objects and advantages are substantially realized by providing a frequency synthesizer for mixing at least two reference frequencies in a wireless communication system using the reference signals for data transmissions and receptions, comprising a local oscillator; frequency dividers for dividing a frequency generated from the local oscillator and generating at least one control signal; and a single side band (SSB) mixer for mixing the reference frequencies, using the frequency generated from the local oscillator and the control signals.

The reference frequencies to be generated may be about 3432 MHz, 3960 MHz, and 4488 MHz.

The local oscillator may generate a frequency of about 7920 MHz.

The frequency dividers may include first and second frequency divider for dividing the frequency generated from the local oscillator and generating a first frequency; and a third frequency divider for dividing the oscillation frequency generated from the local oscillator arid generating a second control signal. The second control signal output from the third frequency divider may be a Quadrature signal of about 3960 MHz having I-phase signals with positive polarity and negative polarity (i.e., 0° and 180° phases), and Q-phase signals with positive polarity and negative polarity (i.e., 90° and 180° phases).

The first frequency divider may divide the local oscillator frequency by 5, and the second frequency divider may divide by 3 the output of the first frequency divider and output the first frequency of about 528 MHz.

The frequency synthesizer may further comprise a polyphase filter (PPF) for generating a Quadrature first control signal from the first frequency generated from the second frequency divider. The Quadrature first control signal may have I-phase signals having positive polarity and negative polarity (i.e., 0° and 180° phases), and Q-phase signals having positive polarity and negative polarity (i.e., 90° and 180° phases).

The SSB mixer may have a path switch containing plural first switches and plural second switches which inputs the second control signal and outputs the I-phase signals having 0° and 180° phases and Q-phase signals having 90° and 180° phases.

The first and second switches may be alternately turned on to select the required phases of the second control signal for performing any of summation or subtraction calculations with respect to the first control signal and the second control signal.

The SSB mixer may have an I-mixer for performing multiplications and subtractions with respect to I-phase and Q-phase signals of the second control signal input from the path switch and the first control signal, and generating an I-phase signal for the reference frequency; and a Q-mixer for performing multiplications and subtractions with respect to I-phase and Q-phase signals of the second control signal input from the path switch and the first control signal, and generating a Q-phase signal for the reference frequency.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Hereinafter, the exemplary embodiments of the present invention will be described in detail with reference to the accompanying drawings.

Figure 1:
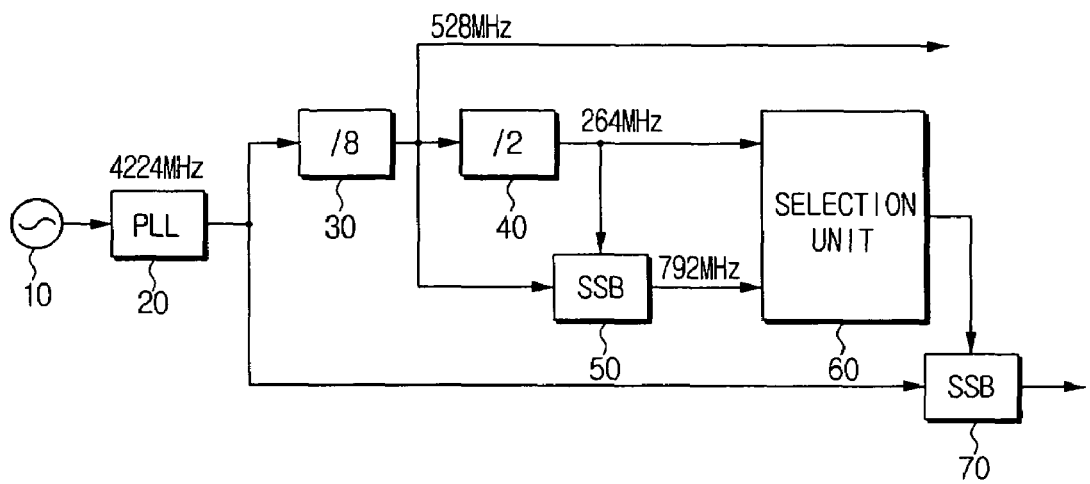
FIG. 1 is a block diagram for showing a general frequency synthesizer.
Figure 2:
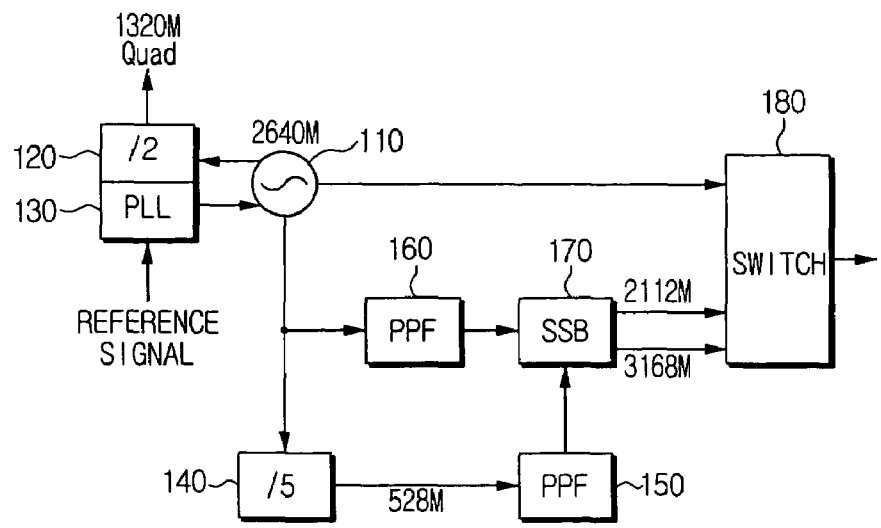
FIG. 2 is a block diagram for showing another general frequency synthesizer.
Figure 3:
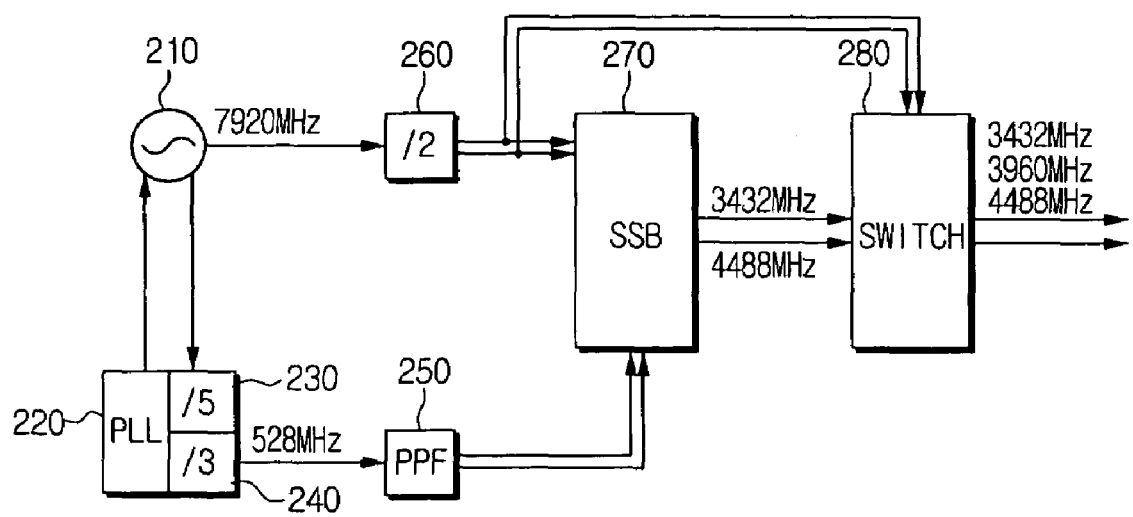
FIG. 3 is a block diagram for showing a frequency synthesizer according to an exemplary embodiment of the present invention.

FIG. 3 is a view for showing a frequency synthesizer for generating plural reference frequencies according to an exemplary embodiment of the present invention.

The frequency synthesizer shown in FIG. 3 can be used in the direct-conversion multi-band orthogonal frequency division multiplexed (OFDM) ultra-wide band (UWB) system.

The frequency synthesizer according to an exemplary embodiment of the present invention has a local oscillator 210, a phase-locked loop (PLL) 220, first and second frequency dividers 230 and 240, a PPF 250, a third frequency divider 260, an SSB mixer 270, and a switch 280.

In the frequency synthesizer according to an exemplary embodiment of the present invention, the local oscillator 210 generates a frequency of about 7920 MHz used to generate reference frequencies of plural frequency sub-bands of the UWB system.

The PLL 220 controls a frequency in order to stabilize the local oscillator frequency generated from the local oscillator 210.

The first frequency divider 230 divides by 5 the reference frequency of 7920 MHz generated from the local oscillator 210 and generates a signal of about 1584 MHz, and the second frequency divider 240 divides by 3 the frequency of 1584 MHz generated from the first frequency divider 230, so as to generate a first frequency of about 528 MHz.

The PPF 250 shifts the phase of the 528 MHz signal by 90° to generate the I-signal and the Q-signal, that is, Quadrature signals, having the 90° phase difference therebetween, and additionally generates positive and negative polarities (i.e., 0° and 180° phases) of both the I-phase and Q-phase signals. According to the exemplary embodiments of the present invention, the PPF 250 works on the 528 MHz signal to minimize electric power consumption. The 528 MHz Quadrature signal output from the PPF 250 as the first control signal is input to the single side band (SSB) mixer 270.

The third frequency divider 260 divides by 2 the 7920 MHz local oscillator frequency output from the local oscillator 210 to generate an about 3960 MHz Quadrature second control signal with I-phase signals having 0° and 180° phases and Q-phase signals having 90° and 180° phases, and sends the 3960 MHz Quadrature second control signal to the SSB mixer 270.

The SSB mixer 270 mixes the 3960 MHz Quadrature second control signal input from the third frequency divider 260 with the 528 MHz Quadrature first control signal input from the PPF 250, so as to output reference frequencies of about 3432 MHz and about 4488 MHz.

The SSB mixer 270 may be constructed as one SSB mixer with a path switch 271, that inputs and mixes the Quadrature first and second control signals. Description will be made later in detail on a structure of the SSB mixer 270.

The reference frequency Quadrature signals of 3432 MHz and 4488 MHz generated from the SSB mixer 270 are input to the switch 280, and the switch 280 further inputs the 3960 MHz Quadrature signal generated from the third frequency divider 260, and selectively outputs a reference frequency Quadrature signal. Thus, the frequency synthesizer according to the present invention outputs the Quadrature signals of 3432 MHz, 3960 MHz, and 4488 MHz which are the reference frequencies of the three frequency sub-bands.

Figure 4:
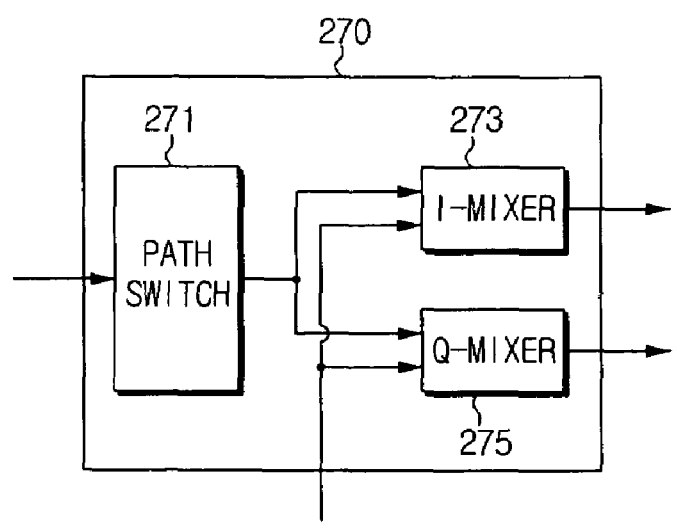
FIG. 4 is a block diagram for showing the SSB generation unit of FIG. 3.

FIG. 4 is a view for showing in detail the SSB mixer of FIG. 3.

The SSB mixer 270 may have a path switch 271, an I-mixer 273, and a Q-mixer 275.

The path switch 271 controls signal flows, and inputs a required signal to the I-mixer 273 and the Q-mixer 275 for summations and subtractions.

The I-mixer 273 generates the reference I-signal, performing multiplications and summations or subtractions with respect to the input first and second control signals of 3960 MHz and 528 MHz.

The Q-mixer 275 generates the reference Q-signal, performing multiplications and summations or subtractions with respect to the input first and second control signals of 3960 MHz and 528 MHz.

Figure 5:
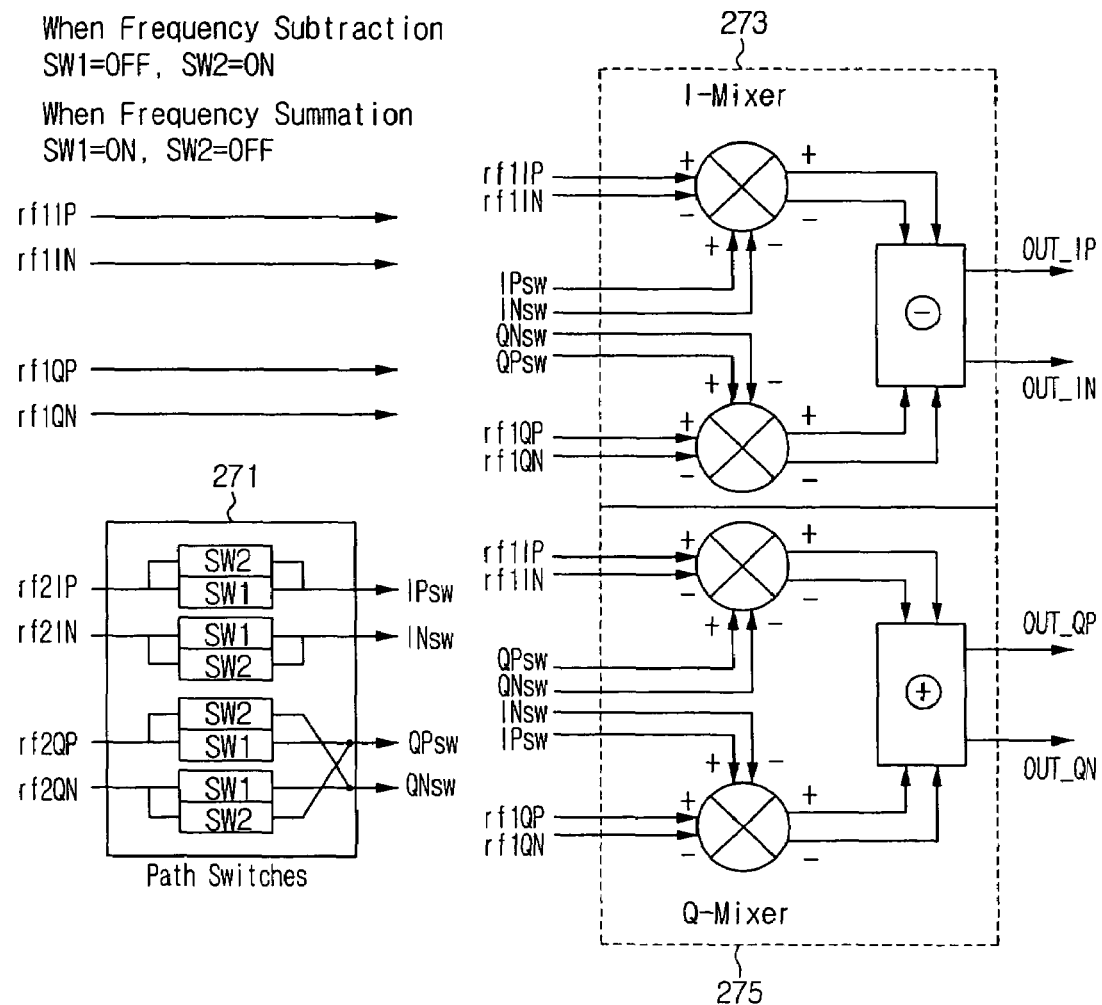
FIG. 5 is a view for explaining flows of signals of the SSB generation unit of FIG. 3.

FIG. 5 is a view for explaining signal flows in the SSB mixer of FIG. 3.

In FIG. 5, the SSB mixer 270 performs multiplications and summations or subtractions, using the input first and second control signals of 3960 MHz and 528 MHz, so as to output 3432 MHz and 4488 MHz reference signals.

For example, if Quadrature signals for two input frequencies are referred to as (cos θ1 and sin θ1) and (cos θ2 and sin θ2), respectively, Equation 1 can be used to describe the Quadrature signals of the two reference frequencies generated as the multiplications and summations or subtractions are performed.

[Equation 1]

$$\cos\theta_1\cos\theta_2 - \sin\theta_1\sin\theta_2 = \cos(\theta_1+\theta_2) \quad (1)$$

$$\cos\theta_1\cos\theta_2 + \sin\theta_1\sin\theta_2 = \cos(\theta_1-\theta_2) \quad (2)$$

$$\sin\theta_1\cos\theta_2 + \cos\theta_1\sin\theta_2 = \sin(\theta_1+\theta_2) \quad (3)$$

$$\sin\theta_1\cos\theta_2 - \cos\theta_1\sin\theta_2 = \sin(\theta_1-\theta_2) \quad (4)$$

The expressions (1) and (3) denote the I-phase signal and the Q-phase signal of Quadrature signals for one reference frequency, and show that the I-signal is generated by subtraction and the Q-signal is generated by summation.

Further, the expressions (2) and (4) denote the I-signal and the Q-signal of Quadrature signals for another reference frequency, and show that the I-signal is generated by summation and the Q-signal is generated by subtraction.

The SSB mixer 270 shown in FIG. 5 is constructed to perform the calculations as expressed Equation 1, by controlling the flow of an input signal.

The path switch 271 may have a four-pair switch unit where each switch pair has a first switch SW1 and a second switch SW2, as shown in FIG. 5. The path switch 271 inputs the phases of the Quadrature second control signal to the SSB mixer 270, turns on the first switch SW1 and outputs the input signal itself upon summation, and turns on the second switch SW2 and outputs a 180° phase-shifted Q-phase signal of the input signal upon subtraction.

The I-mixer 273 has two multipliers and one subtractor, and inputs differential signals having the 180° phase difference between the positive and negative polarity I-phase signals and the positive and negative polarity Q-phase signals of the Quadrature first and second control signals input to the SSB mixer 270, combines the signs and performs calculations expressed in (1) and (2) of Equation 1 as above, and outputs the I-phase of the Quadrature signal for each of two reference frequencies.

The Q-mixer 275 has two multipliers and one adder, inputs differential signals having the 180° phase difference between the positive and negative polarity I-phase signals and the positive and negative polarity Q-phase signals of the Quadrature first and second control signals input to the SSB mixer 270, combines the signs and performs calculations expressed in (3) and (4) of Equation 1 as above, and outputs the Q-phase of the Quadrature signal each for two reference frequencies.

Accordingly, the present invention enables the simplified SSB mixer to mix two Quadrature signals, so as to easily synthesize reference frequency signals of frequency sub-bands without PPFs each employed in the prior art to mix the two Quadrature signals, which enables low-power designs since no additional power is needed to compensate for signal losses caused by the PPFs.

Further, the present invention uses the simplified switches to control signal flows, so the simplified SSB mixer can be implemented with the minimum number of operators.

As stated above, the present invention employs the simplified SSB mixer to mix all the plural Quadrature reference frequencies, so as to be capable of easily mixing reference frequency signals without additional power.

Further, the present invention employs the path switches in the SSB mixer to have minimum hardware components, so as to be capable of controlling signal flows to enable all the calculations necessary to mix frequencies, which facilitates the mixing of reference frequencies.

The foregoing embodiments and advantages are merely exemplary and are not to be construed as limiting the present invention. The present teaching can be readily applied to other types of apparatuses. Also, the descriptions of the exemplary embodiments of the present invention are intended to be illustrative, and not to limit the scope of the claims, and many alternatives, modifications, and variations will be apparent to those skilled in the art.

What is claimed is:

1. A frequency synthesizer for mixing at least two reference frequencies, comprising:

a local oscillator configured to generate a local oscillator frequency;

a plurality of frequency dividers configured to divide the local oscillator frequency and generate at least one control signal; and a single side band (SSB) mixer configured to mix the at least two reference frequencies, using the local oscillator frequency and the at least one control signal, wherein the frequency dividers comprise:
a first frequency divider configured to divide the local oscillator frequency and generate an output frequency;
a second frequency divider configured to divide the output frequency of the first frequency divider and generate a first divided frequency; and
a third frequency divider configured to divide the local oscillator frequency and generate a second control signal being a Quadrature signal.

2. The frequency synthesizer as claimed in claim 1, wherein the reference frequencies to be generated are about 3432 MHz, about 3960 MHz, and about 4488 MHz.

3. The frequency synthesizer as claimed in claim 1, wherein the local oscillator generates a frequency of about 7920 MHz.

4. The frequency synthesizer as claimed in claim 1, wherein the first divided frequency is a frequency of about 528 MHz.

5. The frequency synthesizer as claimed in claim 1, wherein the first frequency divider divides the local oscillator frequency by 5 and the second frequency divider divides the frequency output by the first frequency divider by 3.

6. The frequency synthesizer as claimed in claim 1, wherein the second control signal has a frequency of about 3960 MHz.

7. The frequency synthesizer as claimed in claim 1, further comprising at least one poly-phase filter (PPF) configured to generate a Quadrature signal for the first control signal.

8. The frequency synthesizer as claimed in claim 1, wherein the SSB mixer comprises a path switch comprising:
plural first and second switches configured to output 0° and 180° phases of I-phase and Q-phase first and second control signals input to the path switch.

9. The frequency synthesizer as claimed in claim 8, wherein the plural first and second switches are alternately turned on to perform any of summation or subtraction calculations with respect to the first control signal and the second control signal.

10. The frequency synthesizer as claimed in claim 8, wherein the SSB mixer comprises:
an I-mixer configured to perform multiplications and subtractions with respect to I-phase and Q-phase signals for the second control signal input from the path switch and the first control signal, and generate an I-phase signal for each of the at least two reference frequencies; and
a Q-mixer configured to perform multiplications and subtractions with respect to I-phase and Q-phase signals for the second control signal input from the path switch and the first control signal, and generate a Q-phase signal for each of the at least two reference frequencies.

* * * * *